(12) United States Patent
Lim et al.

(10) Patent No.: US 7,547,951 B2
(45) Date of Patent: Jun. 16, 2009

(54) SEMICONDUCTOR DEVICES HAVING NITROGEN-INCORPORATED ACTIVE REGION AND METHODS OF FABRICATING THE SAME

(75) Inventors: Ha-Jin Lim, Seoul (KR); Jong-Ho Lee, Suwon-si (KR); Hyung-Suk Jung, Suwon-si (KR); Yun Seok Kim, Seoul (KR); Min Joo Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 85 days.

(21) Appl. No.: 11/396,702

(22) Filed: Apr. 4, 2006

(65) Prior Publication Data
US 2007/0001241 A1      Jan. 4, 2007

Related U.S. Application Data

(60) Provisional application No. 60/695,005, filed on Jun. 30, 2005.

(30) Foreign Application Priority Data
Oct. 7, 2005      (KR) ...................... 10-2005-0094566

(51) Int. Cl.
  *H01L 29/78* (2006.01)
(52) U.S. Cl. ................. 257/410; 257/406; 257/411; 257/345; 257/371; 257/E21.686
(58) Field of Classification Search ............... 257/410, 257/406, 411, 345, 371, E21.686
  See application file for complete search history.

(56) References Cited
U.S. PATENT DOCUMENTS
5,557,129 A * 9/1996 Oda et al. ................... 257/345

5,981,325 A * 11/1999 Hung ........................ 438/224

(Continued)

FOREIGN PATENT DOCUMENTS
JP      2003-100896      4/2003

(Continued)

OTHER PUBLICATIONS

Taiwanese Notice of Allowance dated Jan. 11, 2008 with partial English translation.

*Primary Examiner*—Eugene Lee
(74) *Attorney, Agent, or Firm*—Harness, Dickey & Pierce, P.L.C.

(57) ABSTRACT

A semiconductor device may include a semiconductor substrate having a first region and a second region. The nitrogen-incorporated active region may be formed within the first region. A first gate electrode may be formed on the nitrogen-incorporated active region. A first gate dielectric layer may be interposed between the nitrogen-incorporated active region and the first gate electrode. The first gate dielectric layer may include a first dielectric layer and a second dielectric layer. The second dielectric layer may be a nitrogen contained dielectric layer. A second gate electrode may be formed on the second region. A second gate dielectric layer may be interposed between the second region and the second gate electrode. The first gate dielectric layer may have the same or substantially the same thickness as the second gate dielectric layer, and the nitrogen contained dielectric layer may contact with the nitrogen-incorporated active region.

15 Claims, 7 Drawing Sheets

U.S. PATENT DOCUMENTS

| | | | |
|---|---|---|---|
| 5,994,175 A * | 11/1999 | Gardner et al. | 438/199 |
| 6,110,784 A * | 8/2000 | Gardner et al. | 438/287 |
| 6,121,100 A * | 9/2000 | Andideh et al. | 438/305 |
| 6,391,724 B1 * | 5/2002 | Park | 438/279 |
| 6,407,435 B1 * | 6/2002 | Ma et al. | 257/411 |
| 6,579,784 B1 * | 6/2003 | Huang | 438/595 |
| 6,713,846 B1 * | 3/2004 | Senzaki | 257/635 |
| 7,002,224 B2 * | 2/2006 | Li | 257/405 |
| 2002/0106536 A1 * | 8/2002 | Lee et al. | 428/702 |
| 2004/0067619 A1 | 4/2004 | Niimi et al. | |
| 2005/0205939 A1 * | 9/2005 | Lee et al. | 257/371 |
| 2006/0102968 A1 * | 5/2006 | Bojarczuk et al. | 257/392 |

FOREIGN PATENT DOCUMENTS

| | | |
|---|---|---|
| KR | 1020030005068 A | 1/2003 |
| KR | 1020030056880 A | 7/2003 |
| TW | 426972 | 3/2001 |

* cited by examiner

US 7,547,951 B2

SEMICONDUCTOR DEVICES HAVING NITROGEN-INCORPORATED ACTIVE REGION AND METHODS OF FABRICATING THE SAME

PRIORITY STATEMENT

This application claims priority under 35 U.S.C. § 119 to from Korean Patent Application No. 2005-0094566, filed on Oct. 7, 2005 in the Korean Intellectual Property Office (KIPO), the entire contents of which is incorporated herein by reference. This application also claims priority under 35 U.S.C. § 120 to U.S. provisional application Ser. No. 60/695,005, filed Jun. 30, 2005, the entire contents of which are also incorporated herein by reference.

BACKGROUND OF THE INVENTION

1. Field of the Invention

Example embodiments of the present invention relate to semiconductor devices and methods of fabricating the same, for example, to semiconductor devices having nitrogen-incorporated active regions and methods of fabricating the same.

2. Description of the Related Art

In related art semiconductor devices, a silicon oxide layer such as a thermal oxide layer may be used as a film-forming material of a gate dielectric layer. When the silicon oxide layer is formed to a thickness of 2 nm or less leakage current may increase more rapidly. In order to suppress the leakage current from increasing, high-k dielectric layers having a dielectric constant higher than that of the silicon oxide layer may be used as the film-forming material of the gate dielectric layer instead of the silicone oxide layer. The high-k dielectric layer may have a smaller equivalent thickness as compared to the silicon oxide layer. For example, the high-k dielectric layer may be used as the film-forming material of the gate dielectric layer to produce semiconductor devices having a smaller equivalent thickness while maintaining a thickness capable of suppressing leakage current.

Related art semiconductor devices may include transistors requiring different electrical characteristics from each other within a semiconductor substrate. For example, a related art complementary metal oxide semiconductor (CMOS) device may include an N-channel metal oxide semiconductor (NMOS) transistor and a P-channel metal oxide semiconductor (PMOS) transistor within the same substrate. An access transistor may be disposed in a cell region of the semiconductor device, and a drive transistor may be disposed in a peripheral circuit region of the semiconductor device. Different gate dielectric layers for each of the transistors may be formed sequentially in the related art. However, this may require a more complicated fabrication process and/or increase fabrication time.

In another related art method, a semiconductor device may have a plurality of transistors having gate dielectric layers with different characteristics. The gate dielectric layers of the transistors may have a high-k dielectric layer and interface layers formed by a reaction between the high-k dielectric layer and the silicon substrate. A nitrogen ion incorporated layer may be formed on the surface of the silicon substrate prior to the formation of the high-k dielectric layer. Accordingly, the growth of the interface layer may be suppressed. As a result, the interface layer formed on the nitrogen ion incorporated layer may have a thickness smaller than the interface layer formed on the semiconductor substrate without the nitrogen ion incorporated layer. These transistors may exhibit different characteristics.

SUMMARY OF THE INVENTION

At least some example embodiments of the present invention provide semiconductor devices capable of controlling a threshold voltage Vth while using a high-k dielectric layer as a film-forming material of a gate dielectric layer. Example embodiments of the present invention also provide methods of fabricating semiconductor devices capable of controlling a threshold voltage Vth while using a high-k dielectric layer as a film-forming material of a gate dielectric layer.

According to at least one example embodiment of the present invention, a semiconductor device may include a semiconductor substrate having a first region and a second region. A nitrogen-incorporated active region may be formed within the first region. A first gate electrode may be formed on the nitrogen-incorporated active region. A first gate dielectric layer may be interposed between the nitrogen-incorporated active region and the first gate electrode. The first gate dielectric layer may include a high-k dielectric layer and a nitrogen contained high-k dielectric layer. A second gate electrode may be formed on the second region. A second gate dielectric layer may be interposed between the semiconductor substrate of the second region and the second gate electrode. The second gate dielectric layer may also include the high-k dielectric layer. The first gate dielectric layer and the second dielectric layers may have the same or substantially the same thickness. The nitrogen contained high-k dielectric layer may contact the nitrogen-incorporated active region.

In at least some example embodiments of the present invention, a first well may be formed within the first region. A second well may be formed within the second region. The first well may be a p-well and the second well may be an n-well or p-well. The high-k dielectric layer may be, for example, a hafnium oxide (HfO) layer, a zirconium oxide (ZrO) layer, an aluminum oxide (AlO) layer, an aluminum nitride (AlN) layer, a titanium oxide (TiO) layer, a lanthanum oxide (LaO) layer, an yttrium oxide (YO) layer, a gadolinium oxide (GdO) layer, a tantalum oxide (TaO) layer, an aluminate layer, a metal silicate layer or a combination thereof. Each of the first and second gate dielectric layers may have a capping dielectric layer. The capping dielectric layer may be a dielectric layer different from the high-k dielectric layer. For example, the capping dielectric layer may be a HfO layer, a ZrO layer, an AlO layer, an AlN layer, a TiO layer, a LaO layer, an YO layer, a GdO layer, a TaO layer, an aluminate layer, a metal silicate layer or a combination thereof. The capping dielectric layer may contact the first and second gate electrodes. The nitrogen contained high-k dielectric layer may be disposed between the semiconductor substrate and the high-k dielectric layer.

In example embodiments of the present invention, each of the first and second gate electrodes may be a polysilicon layer, a metal layer, a metal silicide layer or a combination thereof. Each of the first and second gate electrodes may have a barrier metal layer. The barrier metal layer may be a titanium (Ti) layer, a tantalum (Ta) layer, a hafnium (Hf) layer, a zirconium (Zr) layer, an aluminum (Al) layer, a copper (Cu) layer, a tungsten (W) layer, a molybdenum (Mo) layer, a platinum (Pt) layer, a ruthenium (Ru) layer, a ruthenium oxide (RuO) layer, a titanium nitride (TiN) layer, a tantalum nitride (TaN) layer, a hafnium nitride (HfN) layer, a zirconium nitride (ZrN) layer, a tungsten nitride (WN) layer, a molybdenum nitride (MoN) layer, a titanium aluminum nitride (TiAlN layer, a tantalum aluminum nitride (TaAlN) layer, a titanium silicon nitride (TiSiN) layer, a tantalum silicon nitride (TaSiN) layer or a combination thereof. The barrier metal layer may be in contact with the first and second gate dielectric layers.

In example embodiments of the present invention, an insulating spacer may be formed on sidewalls of the first and second gate electrodes. The insulating spacer may be a silicon oxide layer, a silicon nitride layer, a silicon oxynitride layer or a combination thereof.

According to another example embodiment of the present invention, a semiconductor substrate having a first region and a second region may be prepared. A nitrogen-incorporated active region may be formed within the first region. A high-k dielectric layer may be formed on the first and second regions. Nitrogen within the nitrogen-incorporated active region may be diffused into the high-k dielectric layer by an annealing process to form a nitrogen contained high-k dielectric layer on the semiconductor substrate of the first region. The thickness of the high-k dielectric layer and the nitrogen contained high-k dielectric layer formed on the first region may be the same or substantially the same as thickness of the high-k dielectric layer formed on the second region.

In at least some example embodiments of the present invention, prior to the formation of the nitrogen-incorporated active region, a first well and a second well may be formed within the first region and second region, respectively. The first well may be a p-well and the second well may be an n-well or p-well.

In example embodiments of the present invention, prior to the formation of the nitrogen-incorporated active region, a pad oxide layer may be formed on the semiconductor substrate. In this example, the pad oxide layer may be removed before the high-k dielectric layer is formed.

In example embodiments of the present invention, the nitrogen-incorporated active region may be formed by performing ion implantation, ammonia ($NH_3$) annealing, plasma nitridation or the like. The ion implantation method may include implanting nitrogen N or nitrogen molecule $N_2$ with a dose of about $1\times10^{14}$ to about $1\times10^{16}$ ions/cm$^2$, inclusive, and an energy of about 5 to about 30 KeV, inclusive. The high-k dielectric layer may be formed of a HfO layer, a ZrO layer, an AlO layer, an AlN layer, a TiO layer, a LaO layer, an YO layer, a GdO layer, a TaO layer, an aluminate layer, a metal silicate layer or a combination thereof. The high-k dielectric layer may be formed by an atomic layer deposition (ALD) method. A capping dielectric layer may be formed on the high-k dielectric layer. The capping dielectric layer may be different from the high-k dielectric layer. The capping dielectric layer may be formed of a HfO layer, a ZrO layer, an AlO layer, an AlN layer, a TiO layer, a LaO layer, an YO layer, a GdO layer, a TaO layer, an aluminate layer, a metal silicate layer or a combination thereof.

In example embodiments of the present invention, a first gate electrode and a second gate electrode may be formed on the capping dielectric layer of the first region and the second region, respectively. The gate electrodes may be composed of a barrier metal layer and a gate conductive layer, which may be stacked sequentially. The barrier metal layer may be formed of a Ti layer, a Ta layer, a Hf layer, a Zr layer, an Al layer, a Cu layer, a W layer, a Mo layer, a Pt layer, a Ru layer, a RuO layer, a TiN layer, a TaN layer, a HfN layer, a ZrN layer, a WN layer, a MoN layer, a TiAlN layer, a TaAlN layer, a TiSiN layer, a TaSiN layer or a combination thereof. The gate conductive layer may be formed of a polysilicon layer, a metal layer, a metal silicide layer or a combination thereof.

In example embodiments of the present invention, an insulating spacer may be formed on sidewalls of the gate electrodes. The annealing process may be performed by exposing the semiconductor substrate to a higher temperature while the insulating spacer is formed.

In example embodiments of the present invention, the annealing process may include exposing the semiconductor substrate to a temperature of about 700° C. to about 1100° C., inclusive.

BRIEF DESCRIPTION OF THE DRAWINGS

The present invention will become more apparent from the description of example embodiments of the present invention, as illustrated in the accompanying drawings. The drawings are not necessarily to scale, emphasis instead being placed upon illustrating the principles of example embodiments of the present invention.

DETAILED DESCRIPTION OF EXAMPLE EMBODIMENTS OF THE PRESENT INVENTION

Figure 1:
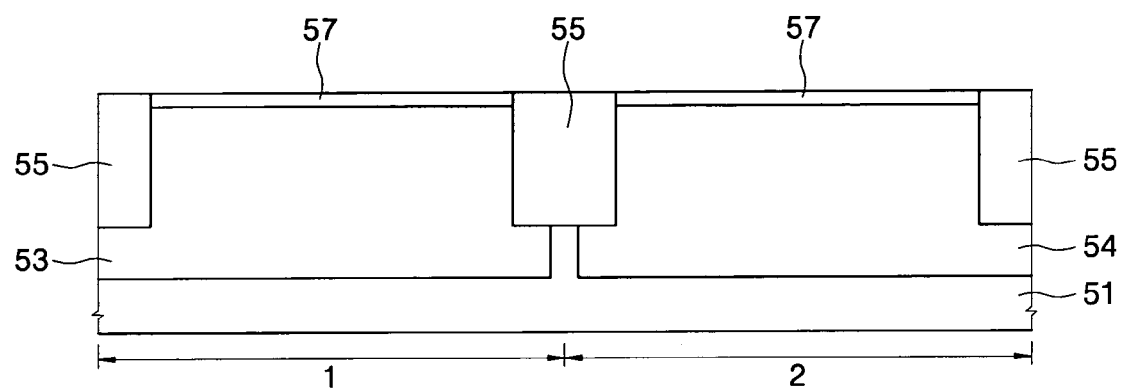
FIGS. 1 to 7 are cross-sectional views illustrating a method of fabricating a semiconductor device having a nitrogen-incorporated active region according to an example embodiment of the present invention.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

FIGS. 1 through 7 illustrate a method of fabricating a semiconductor device having a nitrogen-incorporated active region according to an example embodiment of the present invention. A semiconductor device having a nitrogen-incorporated active region according to an example embodiment of the present invention will now be described with reference to FIG. 7. As shown, a semiconductor substrate 51 may include a first region 1 and a second region 2. The semiconductor substrate 51 may be, for example, a silicon wafer or the like. A first well 53 may be disposed within the first region 1 of the semiconductor substrate 51. A second well 54 may be disposed within the second region 2 of the semiconductor substrate 51. In this example embodiment of the present invention, the first well 53 is the p-well and the second well 54 is the n-well. However, example embodiments of the present invention are not limited to this configuration, for example, the first well 53 may be a p-well and the second well 54 may be an n-well or p-well. The p-well may contain p-type impurities such as boron or the like. The n-well may contain n-type impurities such as phosphorous, arsenic or the like. The first well 53 and the second well 54 may be separated by an isolation layer 55. The isolation layer 55 may have an insulating layer such as a silicon oxide layer.

A nitrogen-incorporated active region 61 may be disposed within the semiconductor substrate 51 of the first region 1. A first gate electrode 73 may be disposed on the nitrogen-incorporated active region 61. A first gate dielectric layer 75' may be disposed between the nitrogen-incorporated active region 61 and the first gate electrode 73. The first gate dielectric layer 75' may include a high-k dielectric layer 63 and a nitrogen contained high-k dielectric layer 63N. The nitrogen-incorporated active region 61 may contact the nitrogen contained high-k dielectric layer 63N.

The nitrogen-incorporated active region 61 may be a region containing nitrogen N or nitrogen molecule $N_2$ implanted to a given or desired depth from a top surface of the first region 1 of the semiconductor substrate 51. For example, the nitrogen-incorporated active region 61 may be disposed in an upper region of the first well 53.

The first gate electrode 73 may include a gate conductive layer 69. The gate conductive layer 69 may be a polysilicon layer, a metal layer, a metal layer, a metal silicide layer, a combination thereof or the like. In addition, the first gate electrode 73 may further include a barrier metal layer 67. For example, the first gate electrode 73 may be composed of the barrier metal layer 67 and the gate conductive layer 69, which may be stacked sequentially. In this example, the barrier metal layer 67 may contact the first gate dielectric layer 75'. When the gate conductive layer 69 is a polysilicon layer, the barrier metal layer 67 may reduce a poly depletion effect of the gate dielectric layer 69.

The barrier metal layer 67 may be, for example, a Ti layer, a Ta layer, a Hf layer, a Zr layer, an Al layer, a Cu layer, a W layer, a Mo layer, a Pt layer, a Ru layer, a RuO layer, a TiN layer, a TaN layer, a HfN layer, a ZrN layer, a WN layer, a MoN layer, a TiAlN layer, a TaAlN layer, a TiSiN layer, a TaSiN layer, a combination thereof or the like.

The first gate dielectric layer 75' may further include a capping dielectric layer 65. The first gate dielectric layer 75' may be composed of the nitrogen contained high-k dielectric layer 63N, the high-k dielectric layer 63 and/or the capping dielectric layer 65, which may be stacked sequentially. The capping dielectric layer 65 may be in contact with the first gate electrode 73.

The high-k dielectric layer 63 may be a HfO layer, a ZrO layer, an AlO layer, an AlN layer, a TiO layer, a LaO layer, an YO layer, a GdO layer, a TaO layer, an aluminate layer, a metal silicate layer, a combination thereof or the like.

The nitrogen contained high-k dielectric layer 63N may be a result of diffusion of nitrogen within the nitrogen-incorporated active region 61 into the high-k dielectric layer 63. In this example, the nitrogen contained high-k dielectric layer 63N may be disposed along the surface where it may be in contact with the nitrogen-incorporated active region 61 within the high-k dielectric layer 63. The nitrogen contained high-k dielectric layer 63N and the nitrogen-incorporated active region 61 may reduce a threshold voltage Vth of an NMOS transistor.

The capping dielectric layer 65 may be a dielectric layer different from the high-k dielectric layer 63. The capping dielectric layer 65 may be a HfO layer, a ZrO layer, an AlO layer, an AlN layer, a TiO layer, a LaO layer, an YO layer, a GdO layer, a TaO layer, an aluminate layer, a metal silicate layer, a combination thereof or the like.

A hard mask pattern 71 (e.g., a silicon nitride layer or the like) may be disposed on the first gate electrode 73. An insulating spacer 79 may be disposed on sidewalls of the hard mask pattern 71 and the first gate electrode 73. The insulating spacer 79 may be a silicon oxide layer, a silicon nitride layer, a silicon oxynitride layer, a combination layer thereof or the like.

A first impurity region (e.g., a lower concentration impurity region) 81 may be disposed within the semiconductor substrate 51 below the insulating spacer 79. The first impurity region 81 may be an impurity region of a different conductivity-type from the first well 53. For example, if the first well 53 is a p-well, the first impurity region 81 may be a region having n-type impurity ions.

A first source and a first drain region 83 may be disposed within the semiconductor substrate 51 at sides of the first gate electrode 73. The first source and drain regions 83 may have higher concentrations of impurities with the same conductivity type as the first impurity region 81. The first source and drain regions 83 may be higher concentration impurity regions having a different conductivity type from the first well 53. If the first well 53 is a p-well, the first source and drain regions 83 may be regions having n-type impurity ions. The first source and drain regions 83 may contact the first impurity regions 81.

A second gate electrode 74 may be disposed on the semiconductor substrate 51 of the second region 2. A second gate dielectric layer 76 may be disposed between the semiconductor substrate 51 and the second gate electrode 74. For example, the second gate dielectric layer 76 may be disposed on the second well 54. The second gate dielectric layer 76 may include the high-k dielectric layer 63.

The second gate electrode 74 may include a gate conductive layer 69. The gate conductive layer 69 may be a polysilicon layer, a metal layer, a metal silicide layer, a combination thereof or the like. The second gate electrode 74 may further include a barrier metal layer 67. For example, the second gate electrode 74 may be composed of the barrier metal layer 67 and the gate conductive layer 69, which may be stacked sequentially. In this example, the barrier metal layer 67 may contact the second gate dielectric layer 76. When the gate conductive layer 69 is a polysilicon layer, the barrier metal layer 67 may reduce a poly depletion effect of the gate conductive layer 69. If the second well 54 is an n-well and the gate conductive layer 69 is a boron-doped polysilicon layer, the barrier metal layer 67 may suppress and/or prevent boron from penetrating into the semiconductor substrate 51. The barrier metal layer 67 may increase the threshold voltage Vth of NMOS and/or PMOS transistors.

The barrier metal layer 67 may be a Ti layer, a Ta layer, a Hf layer, a Zr layer, an Al layer, a Cu layer, a W layer, a Mo layer, a Pt layer, a Ru layer, a RuO layer, a TiN layer, a TaN layer, a HfN layer, a ZrN layer, a WN layer, a MoN layer, a TiAlN layer, a TaAlN layer, a TiSiN layer, a TaSiN layer, a combination thereof or the like.

The second gate dielectric layer 76 may be composed of the high-k dielectric layer 63 and the capping dielectric layer 65, which may be stacked sequentially. The capping dielectric layer 65 may contact the second gate electrode 74, and may reduce a threshold voltage Vth of a PMOS transistor and/or increase a threshold voltage Vth of an NMOS transistor. For example, the high-k dielectric layer 63 may be an HfSiO layer, and the capping dielectric layer 65 may be an AlO layer.

The high-k dielectric layer 63 may be a HfO layer, a ZrO layer, an AlO layer, an AlN layer, a TiO layer, a LaO layer, an YO layer, a GdO layer, a TaO layer, an aluminate layer, a metal silicate layer, a combination thereof or the like.

The capping dielectric layer 65 may be a dielectric layer different from the high-k dielectric layer 63. The capping dielectric layer 65 may be a HfO layer, a ZrO layer, an AlO layer, an AlN layer, a TiO layer, a LaO layer, an YO layer, a GdO layer, a TaO layer, an aluminate layer, a metal silicate layer, a combination thereof or the like.

A hard mask pattern 71 may be disposed on the second gate electrode 74, and may be comprised of a silicon nitride layer or the like. An insulating spacer 79 may be disposed on sidewalls of the hard mask pattern 71 and the second gate electrode 74. The insulating spacer 79 may be a silicon oxide layer, a silicon nitride layer, a silicon oxynitride layer, a combination thereof or the like.

A second impurity region (e.g., a lower concentration impurity region) 84 may be disposed within the semiconductor substrate 51 below the insulating spacer 79. The second impurity region 84 may be an impurity region having a different conductivity type from the second well 54. For example, the second impurity region 84 may have p-type impurity ions when the second well 54 is an n-well, and may have n-type impurity ions when the second well 54 is a p-well.

A second source and drain regions 86 may be disposed within the semiconductor substrate 51 at sides of the second gate electrode 74. The second source and drain regions 86 may have higher concentrations of impurities with the same conductivity type as the second impurity region 84. The second source and drain regions 86 may be higher concentration impurity regions having a different conductivity type from the second well 54. The source and drain regions 86 may be regions having p-type impurity ions when the second well 54 is an n-well, and may be regions having n-type impurity ions when the second well 54 is a p-well. In addition, the source and drain regions 86 may contact the second impurity region 84.

In the related art, a first gate dielectric layer 75' and the second gate dielectric layer 76 may be formed with different thickness to implement transistors having different characteristics. However, in at least some example embodiments of the present invention, the first gate electrode 73, the first gate dielectric layer 75', the first well 53 and/or the first source and drain regions 83 may constitute a first transistor. The second gate electrode 74, the second gate dielectric layer 76, the second well 54 and/or the second source and drain regions 86 may constitute a second transistor. The first gate dielectric layer 75' may have a first thickness T1, and the second gate dielectric layer 76 may have a second thickness T2. In this example, the first thickness T1 may be the same or substantially the same as the second thickness T2. The first gate dielectric layer 75' may have the same or substantially the same thickness as the second gate dielectric layer 76. The first transistor may have a relatively lower threshold voltage Vth because of the nitrogen-incorporated active region 61 and/or the nitrogen contained high-k dielectric layer 63N. Accordingly, the first transistor and the second transistor may have different electrical characteristics.

A method of fabricating a semiconductor device having a nitrogen-incorporated active region according to an example embodiment of the present invention will be described with reference to FIGS. 1 through 7.

Referring to FIG. 1, a semiconductor substrate 51 having a first region 1 and a second region 2 may be prepared. A first well 53, a second well 54 and an isolation layer 55 may be formed within the semiconductor substrate 51.

The semiconductor substrate 51 may be a silicon wafer or the like. The first well 53 may be formed within the first region 1 of the semiconductor substrate 51. The second well 54 may be formed within the second region 2 of the semiconductor substrate 51. In this example, the first well 53 may be a p-well and the second well 54 may be an n-well. The p-well may be formed by implanting p-type impurities such as boron into the semiconductor substrate 51. The n-well may be formed by implanting n-type impurities such as phosphorous or arsenic into the semiconductor substrate 51.

The first well 53 and the second well 54 may be separated by the isolation layer 55. The isolation layer 55 may be formed of an insulating layer such as a silicon oxide layer. For example, the isolation layer 55 may be formed of a high-density plasma (HDP) oxide layer. The first well 53 and the second well 54 may be formed before or after the isolation layer 55 is formed, or may be formed before the isolation layer 55 is formed.

A process of implanting channel ions into each of the first well 53 and the second well 54 may be added to control the threshold voltage Vth, however, a discussion of this process will be omitted for the sake of brevity.

A pad oxide layer 57 may be formed on the semiconductor substrate 51 having the first well 53 and the second well 54. The pad oxide layer 57 may be formed of a silicon oxide layer. For example, the pad oxide layer 57 may be formed of a silicon oxide layer having a thickness of about 11 nm using a thermal oxidation method. However, the formation of, and the pad oxide layer 57 itself, may be omitted.

Figure 2:
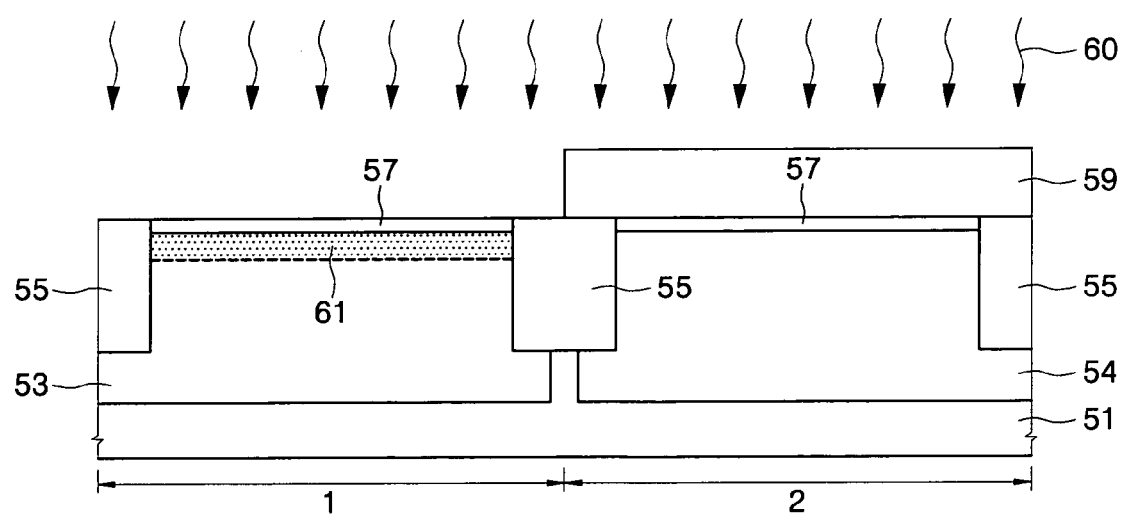

Referring to FIG. 2, a mask pattern 59 may be formed on the semiconductor substrate 51 exposing the pad oxide layer 57 of the first region 1. When the formation of the pad oxide layer 57 is omitted, a top surface of the first well 53 may be exposed.

A nitrogen-incorporated active region 61 may be formed within the semiconductor substrate 51 of the first region 1. The nitrogen-incorporated active region 61 may be formed by selectively implanting nitrogen N or nitrogen molecule $N_2$ into the first well 53 using mask pattern 59 as an ion implantation mask. The mask pattern used in the process of implanting the channel ions may be used as the ion implantation mask.

Implanting nitrogen N or nitrogen molecule $N_2$ into the first well 53 may be performed by an ion implantation method 60, an ammonia ($NH_3$) annealing method, a plasma nitridation method or the like. In an example using the ion implantation method 60, the nitrogen N or nitrogen molecule $N_2$ may be implanted with a dose of about $1\times10^{14}$ to about $1\times10^{16}$ ions/cm$^2$, inclusive, and an energy of about 5 to about 30 KeV, inclusive. For example, when the pad oxide layer 57 is omitted, the nitrogen N or nitrogen molecule $N_2$ may be implanted with a dose of about $1\times10^{15}$ ions/cm$^2$ and an energy of about 10 KeV. When the pad oxide layer 57 is present, the nitrogen N or nitrogen molecule $N_2$ may be implanted with a dose of about $1\times10^{15}$ ions/cm$^2$ and an energy about 30 KeV. In this example, the pad oxide layer 57 may reduce and/or minimize damage to the semiconductor substrate 51 when implanting the nitrogen N or nitrogen molecule $N_2$.

A first annealing process may be performed to activate the nitrogen N or nitrogen molecule $N_2$ implanted into the semiconductor substrate 51. The first annealing process may include exposing the semiconductor substrate 51 to a temperature of about 700° C. to about 1100° C., inclusive. For example, the first annealing process may be performed for about 10 seconds at a temperature of about 1000° C. However, the first annealing process may be omitted.

Figure 3:
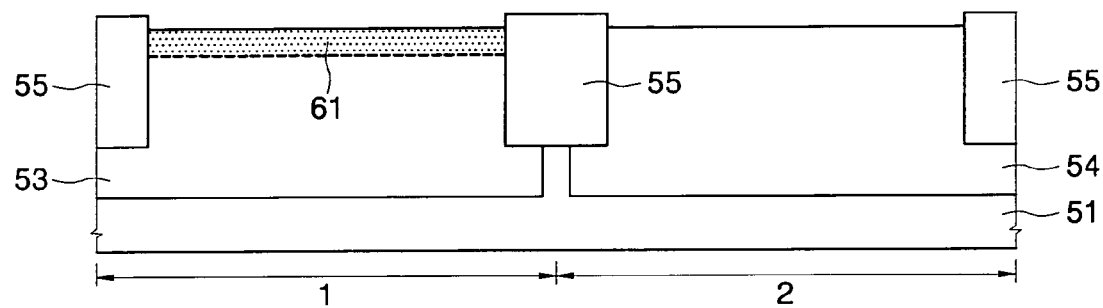

Referring to FIG. 3, the mask pattern 59 or the mask pattern and the pad oxide layer 57 may be removed to expose the semiconductor substrate 51. The pad oxide layer 57 may be removed by a cleaning process using an oxide layer etching solution. As a result, the nitrogen-incorporated active region 61 may remain at a desired depth from a top surface of the first region 1 of the semiconductor substrate 51. For example, the nitrogen-incorporated active region 61 may be formed in an upper region of the first well 53.

Figure 4:
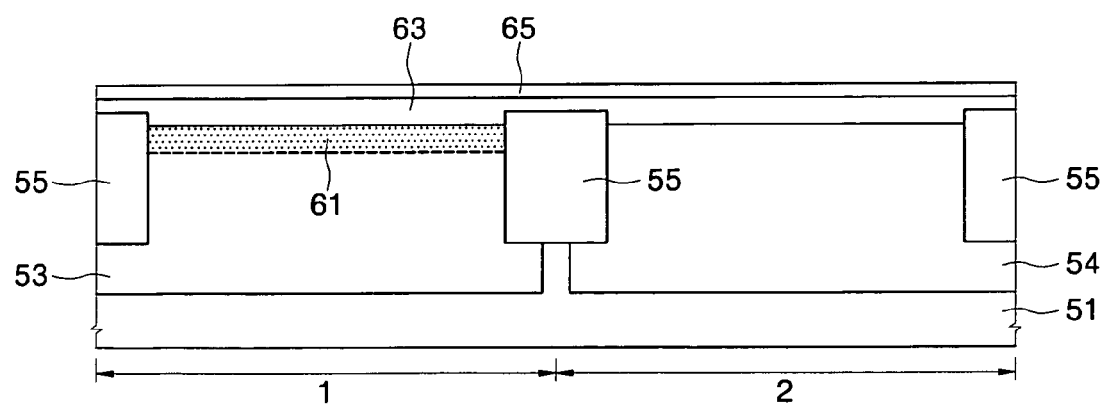

Referring to FIG. 4, a high-k dielectric layer 63 may be formed on the exposed semiconductor substrate 51. The high-k dielectric layer 63 may cover (e.g., uniformly or substantially uniformly cover) top surfaces of the first well 53 and the second well 54. In this example, the high-k dielectric layer 63 may cover a top surface of the nitrogen-incorporated active region 61. A capping dielectric layer 65 may be formed on the high-k dielectric layer 63. The capping dielectric layer 65 may be a dielectric layer different from the high-k dielectric layer 63. The high-k dielectric layer 63 and/or the capping dielectric layer 65 may be formed by an ALD method, a chemical vapor deposition (CVD) method, a physical vapor deposition (PVD) method or the like.

The ALD method may be performed at a relatively lower temperature, and growth of an interface oxide layer may be suppressed and/or minimized between the semiconductor substrate 51 and the high-k dielectric layer 63. For example, when the high-k dielectric layer 63 is formed by the ALD method, growth of the interface oxide layer may be suppressed, and the high-k dielectric layer 63 may be formed to have the same or substantially the same thickness on top surfaces of the first well 53 and the second well 54. As a result, a dielectric layer having a uniform or substantially uniform thickness may be formed on the top surfaces of the first well 53 and the second well 54.

For example, the high-k dielectric layer 63 may be formed of a HfSiO layer having a thickness of about 3 nm using the ALD method, and the capping dielectric layer 65 may be formed of an AlO layer having a thickness of about 1 nm.

In addition, the high-k dielectric layer 63 may be formed of a HfO layer, a ZrO layer, an AlO layer, an AlN layer, a TiO layer, a LaO layer, an YO layer, a GdO layer, a TaO layer, an aluminate layer, a metal silicate layer, a combination thereof or the like. The capping dielectric layer 65 may be formed of a HfO layer, a ZrO layer, an AlO layer, an AlN layer, a TiO layer, a LaO layer, an YO layer, a GdO layer, a TaO layer, an aluminate layer, a metal silicate layer, a combination thereof or the like.

After the high-k dielectric layer 63 and the capping dielectric layer 65 are formed, a second annealing process may be performed on the semiconductor substrate 51. The second annealing process may include exposing the semiconductor substrate 51 to a temperature of about 700° C. to about 1100° C., inclusive. For example, the second annealing process may be performed for about 30 seconds at a temperature of about 900° C. However, the second annealing process may be omitted.

Figure 5:
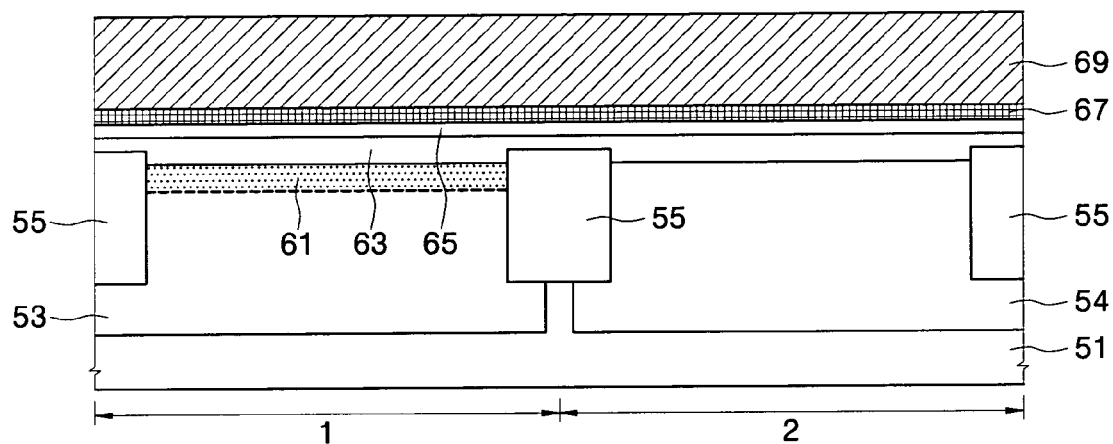

Referring to FIG. 5, a barrier metal layer 67 and a gate conductive layer 69 may be formed (e.g., sequentially) on the capping dielectric layer 65.

The barrier metal layer 67 may be formed of a Ti layer, a Ta layer, a Hf layer, a Zr layer, an Al layer, a Cu layer, a W layer, a Mo layer, a Pt layer, a Ru layer, a RuO layer, a TiN layer, a TaN layer, a HfN layer, a ZrN layer, a WN layer, a MoN layer, a TiAlN layer, a TaAlN layer, a TiSiN layer, a TaSiN layer, a combination thereof or the like. The gate conductive layer 69 may be formed of a polysilicon layer, a metal layer, a metal silicide layer, a combination thereof or the like.

Figure 6:
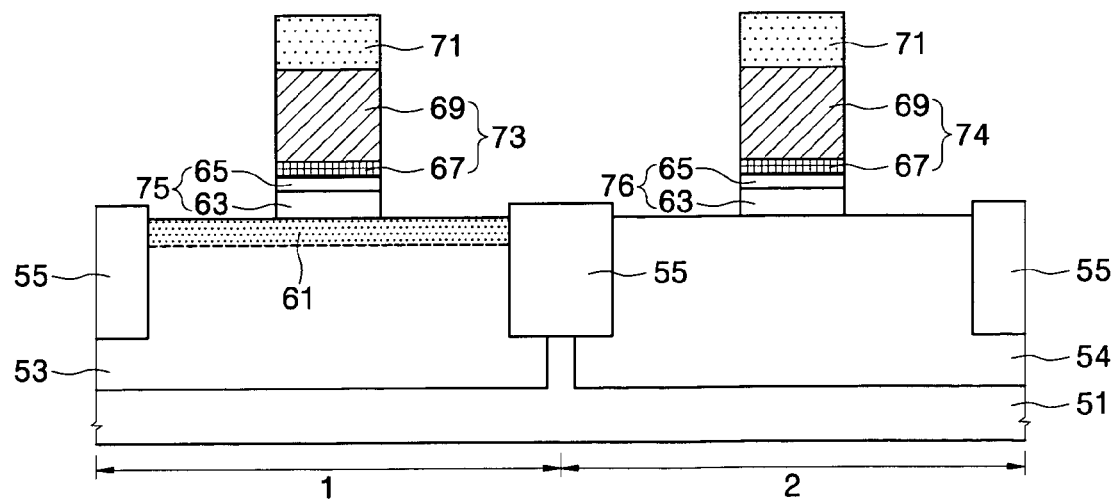

Referring to FIG. 6, a hard mask pattern 71 may be formed on the gate conductive layer 69. The hard mask pattern 71 may be formed of a silicon nitride or the like.

Before the hard mask pattern 71 is formed, impurity ions may be implanted into the gate conductive layer 69. When the first well 53 and the second well 54 are impurity regions having different conductivity types, the gate conductive layer 69 may be divided into a region formed on the first region 1 and a region formed on the second region 2 so that the impurity ions having different conductivity types from each other are implanted into the respective regions. For example, when the second well 54 is the n-well, boron may be selectively implanted into the gate conductive layer 69 formed on the second well 2. In this example, the barrier metal layer 67 may act to suppress and/or prevent penetration of the boron into the semiconductor substrate 51. For example, the barrier metal layer 67 may suppress and/or prevent penetration of the boron into the second well 54. After the impurity ions are implanted into the gate conductive layer 69, a third annealing process may be performed on the semiconductor substrate 51. The third annealing process may include exposing the semiconductor substrate 51 to a temperature of about 700° C. to about 1100° C., inclusive. For example, the third annealing process may be performed for about 10 seconds at a temperature of about 950° C. However, the third annealing process may be omitted.

The gate conductive layer 69 and the barrier metal layer 67 may be etched using the hard mask pattern 71 as an etch mask to form a first gate electrode 73 and a second gate electrode 74. The first gate electrode 73 may be composed of the barrier metal layer 67 and the gate conductive layer 69, which may be stacked (e.g., sequentially stacked) on the first region 1 of the semiconductor substrate 51. The second gate electrode 74 may be composed of the barrier metal layer 67 and the gate conductive layer 69, which may be stacked (e.g., sequentially stacked) on the second region 2 of the semiconductor substrate 51.

After the gate electrodes 73 and 74 are formed, the capping dielectric layer 65 and the high-k dielectric layer 63 may be patterned to form a first preliminary gate dielectric layer 75 and a second gate dielectric layer 76. The first preliminary gate dielectric layer 75 may be composed of the high-k dielectric layer 63 and the capping dielectric layer 65, which may be stacked (e.g., sequentially stacked) on the first region 1 of the semiconductor substrate 51. The second gate dielectric layer 76 may be composed of the high-k dielectric layer 63 and the capping dielectric layer 65, which may be stacked (e.g., sequentially stacked) on the second region 2 of the semiconductor substrate 51. For example, the first preliminary gate dielectric layer 75 may be formed between the semiconductor substrate 51 and the first gate electrode 73, and the second gate dielectric layer 76 may be formed between the semiconductor substrate 51 and the second gate electrode 74.

As a result, a top surface of the first well 53 at both sides of the first gate electrode 73 may be exposed, and a top surface of the second well 54 at both sides of the second gate electrode 74 may be exposed.

Figure 7:
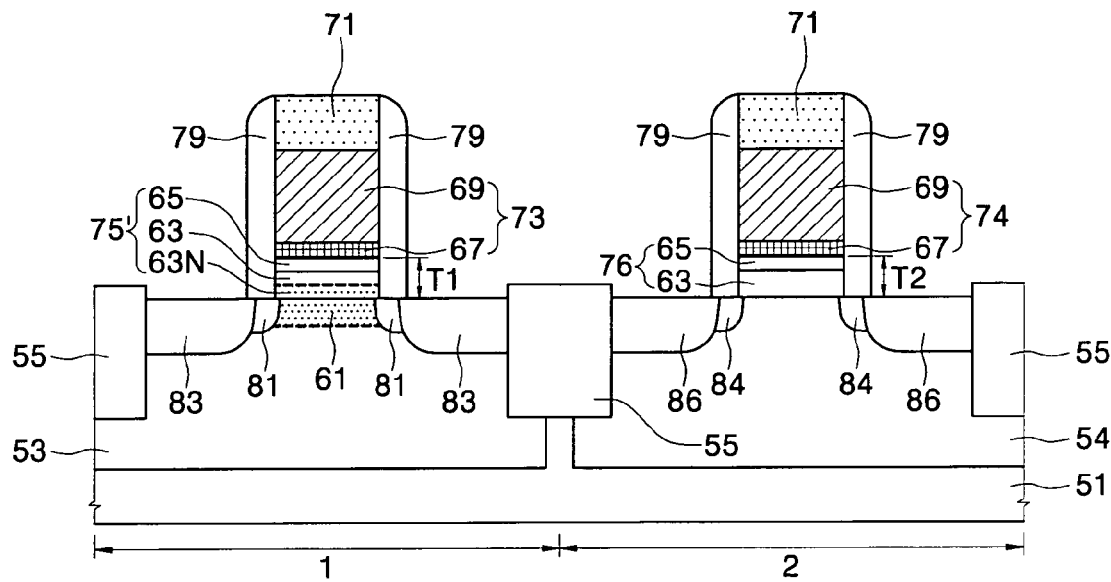

Referring to FIG. 7, a first impurity region 81 and a second impurity region 84 may be formed within the first well 53 and the second well 54, respectively, using the hard mask pattern 71 and the gate electrodes 73 and 74 as ion implantation masks. When the first well 53 is the p-well, the first impurity region 81 may be formed by implanting n-type impurity ions. When the second well 54 is the n-well, the second impurity region 84 may be formed by implanting p-type impurity ions, and when the second well 54 is the p-well, the second impurity region 84 may be formed by implanting n-type impurity ions. The first impurity region 81 and the second impurity region 84 may be formed sequentially or concurrently.

Insulating spacers 79 may be formed on sidewalls of the gate electrodes 73 and 74 and the hard mask pattern 71. The insulating spacer 79 may be formed of a silicon oxide layer, a silicon nitride layer, a silicon oxynitride layer, a combination thereof or the like. For example, a silicon oxide layer and a silicon nitride layer may be formed sequentially on the semiconductor substrate 51 using a CVD method. The silicon nitride layer and the silicon oxide layer may be continuously and/or anisotropically etched until the top surface of the semiconductor substrate 51 is exposed to form the insulating spacer 79.

While the insulating spacer 79 is formed, the semiconductor substrate 51 may be exposed to a temperature of about 700° C. or higher. In this example, the nitrogen within the nitrogen-incorporated active region 61 may be diffused into the high-k dielectric layer 63 forming a nitrogen contained high-k dielectric layer 63N. As a result, a first gate dielectric layer 75' may be formed between the semiconductor substrate 51 and the first gate electrode 73. For example, the first gate dielectric layer 75' may be composed of the nitrogen contained high-k dielectric layer 63N, the high-k dielectric layer 63, and the capping dielectric layer 65, which may be stacked (e.g., sequentially). The nitrogen contained high-k dielectric layer 63N may be formed along a surface contacting the nitrogen-incorporated active region 61 within the high-k dielectric layer 63. The nitrogen contained high-k dielectric layer 63N may be formed by the second and/or third annealing process.

A nitrogen-incorporated region may be selectively formed within a semiconductor substrate, a high-k dielectric layer may be deposited thereon, and the semiconductor substrate may be exposed to a higher temperature for an extended period of time to adjust the thickness of an interface layer to be formed between the high-k dielectric layer and the semiconductor substrate. For example, the interface layer formed on the nitrogen-incorporated region may have a smaller thickness.

According to at least one example embodiment of the present invention, the first gate dielectric layer 75' may be formed to have a thickness T1, and the second gate dielectric layer 76 may be formed to have a thickness T2. The first thickness T1 may be equal or substantially equal to the second thickness T2, and the first gate dielectric layer 75' may have the same or substantially the same thickness as the second gate dielectric layer 76. The high-k dielectric layer 63 may suppress additional oxidation of the surface of the semiconductor substrate 51. The interface oxide layer may be formed to the same or substantially the same thickness on top surfaces of the first well 53 and the second well 54, and the high-k dielectric layer 63 may suppress and/or minimize formation of the interface oxide layer on the surface of the semiconductor substrate 51. As a result, the first gate dielectric layer 75' and the second gate dielectric layer 76 may have the same or substantially the same thickness.

First source and drain regions 83 may be formed within the semiconductor substrate 51 at both sides of the first gate electrode 73 and second source and drain regions 86 may be formed within the semiconductor substrate 51 at both sides of the second gate electrode 74 using the insulating spacer 79 and the hard mask pattern 71 as ion implantation masks. When the first well 53 is the p-well, the first source and drain regions 83 may be formed by implanting n-type impurity ions. When the second well 54 is the n-well, the second source and drain regions 86 may be formed by implanting p-type impurity ions, and when the second well 54 is the p-well, the second source and drain regions 86 may be formed by implanting n-type impurity ions. The first source and drain regions 83 and the second source and drain regions 86 may be formed concurrently or sequentially. As a result, the first impurity region 81 and the second impurity region 84 may remain below the insulating spacer 79.

A fourth annealing process may be performed on the semiconductor substrate 51 to activate the ions implanted into the source and drain regions 83 and 86. The fourth annealing process may include exposing the semiconductor substrate 51 to a temperature of about 700° C. to about 1100° C., inclusive. In this example, the nitrogen within the nitrogen-incorporated active region 61 may be diffused into the high-k dielectric layer 63 to form the nitrogen contained high-k dielectric layer 63N. However, the fourth annealing process may be omitted.

Figure 8:
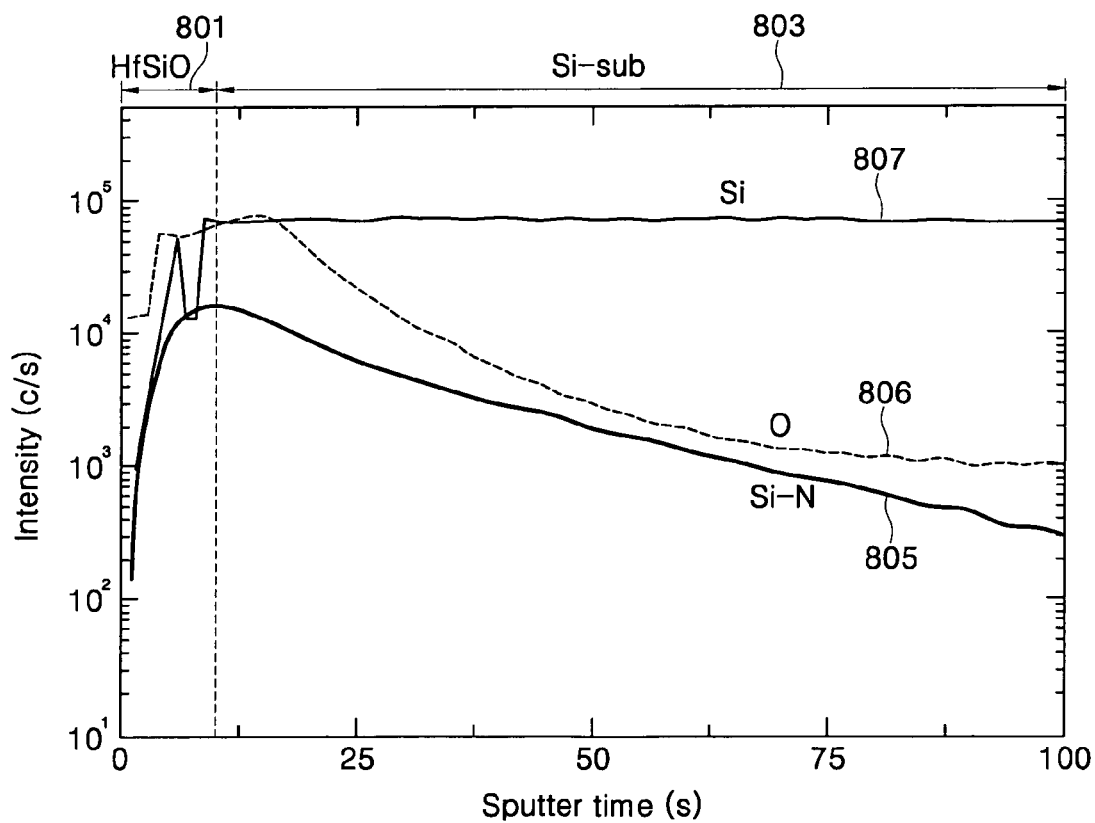
FIG. 8 is a diagram showing a nitrogen distribution of a gate dielectric layer fabricated according to an example embodiment of the present invention.

FIG. 8 is a characteristic diagram showing a nitrogen distribution of the gate dielectric layer formed in accordance with an example embodiment of the present invention. Referring to FIG. 8, a nitrogen-incorporated active region is formed within the semiconductor substrate by implanting Nitrogen with a dose of $1\times10^{15}$ ions/cm$^2$ and an energy of 10 KeV. A high-k dielectric layer is formed on the semiconductor substrate having the nitrogen-incorporated active region. The high-k dielectric layer may be formed of an HfSiO layer having a thickness of 3 nm using an ALD method. The semiconductor substrate having the high-k dielectric layer is annealed for 30 seconds at a temperature of 900° C. The annealed semiconductor substrate is analyzed using a secondary ion mass spectrometry (SIMS).

In the diagram of FIG. 8, sputter time [s] is plotted versus intensity [c/s]. Si—N shows a profile of the curve 805, O shows a profile of the curve 806, and Si shows a profile of the curve 807. The interval 801 corresponds to the HfSiO layer and the interval 803 corresponds to the semiconductor substrate. As seen from the curve 805, a larger number of nitrogen ions may be detected in a contact region between the HfSiO layer and the semiconductor substrate. This may indicate that the nitrogen within the nitrogen-incorporated active region has diffused into the HfSiO layer.

Figure 9:
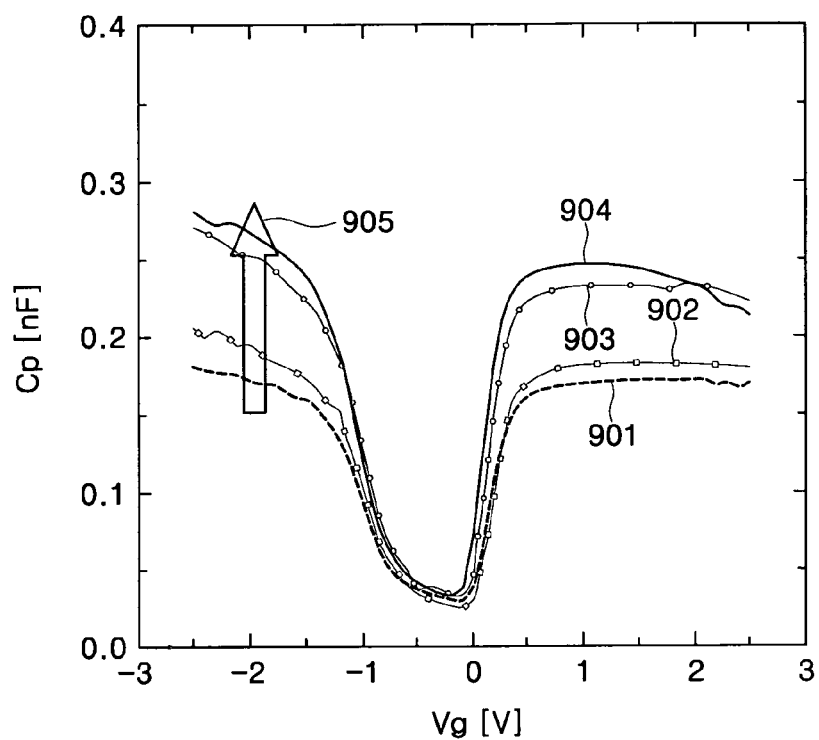
FIG. 9 is a graph showing change in a C-V characteristic of an NMOS transistor due to formation of a nitrogen-incorporated active region in the gate dielectric layer by a thermal oxidation method.

FIG. 9 is a characteristic diagram showing an C-V change in an NMOS when the nitrogen-incorporated active region in the gate dielectric layer is formed using a thermal oxidation method. Referring to FIG. 9, first to fourth semiconductor substrates each having a p-well are prepared. A nitrogen-incorporated active region is formed in each of the second to fourth semiconductor substrates. Nitrogen is implanted into the second semiconductor substrate with a dose of $1\times10^{14}$ ions/cm$^2$ and an energy of 10 KeV, into the third semiconductor substrate with a dose of $5\times10^{14}$ ions/cm$^2$ and an energy of 10 KeV, and into the fourth semiconductor substrate with a dose of $1\times10^{15}$ ions/cm$^2$ and an energy of 10 KeV, using an ion implantation method. A gate dielectric layer is formed to a thickness of 3.3 nm on each of the first to fourth semiconductor substrates by a thermal oxidation method. NMOS transistors are formed in the first to fourth semiconductor substrates.

In the graph of FIG. 9, capacitance Cp [nF] is plotted versus gate voltage Vg [V]. The curves 901, 902, 903, and 904 show C-V characteristics of the NMOS transistors formed in the first, second, third and fourth semiconductor substrates, respectively.

As shown in FIG. 9, the C-V characteristic changes in the direction of an arrow 905 according to the dose of nitrogen used to form the nitrogen-incorporated active region. In other words, a capacitance equivalent thickness CET of the gate dielectric layer may be reduced without change of Vfb. This may indicate that a thicker gate dielectric layer has been formed on the first semiconductor substrate without the nitrogen-incorporated active region and/or a thinner gate dielectric layer has been formed on the fourth semiconductor substrate having the higher dose of nitrogen.

Figure 10:
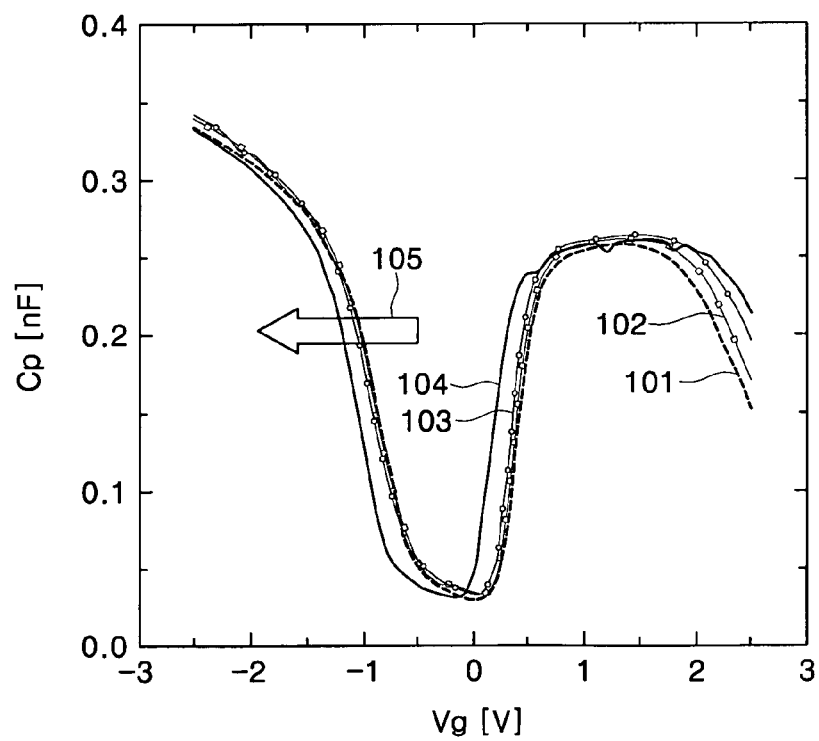
FIG. 10 is a graph showing change in a C-V characteristic of an NMOS transistor due to formation of a nitrogen-incorporated active region in the high-k dielectric layer by an ALD method.

FIG. 10 is a graph showing change in a C-V characteristic of NMOS transistors when a nitrogen-incorporated active region is formed in the high-k dielectric layer using an ALD method. Referring to FIG. 10, first to fourth semiconductor substrates each having a p-well are prepared. A nitrogen-incorporated active region is formed in each of the second to fourth semiconductor substrates. Nitrogen is implanted into the second semiconductor substrate with a dose of $1\times10^{14}$ ions/cm$^2$ and an energy of 10 KeV, into the third semiconductor substrate with a dose of $5\times10^{14}$ ions/cm$^2$ and an energy of 10 KeV, and into the fourth semiconductor substrate with a dose of $1\times10^{14}$ ions/cm$^2$ and an energy of 10 KeV, using an ion implantation method. Subsequently, an HfSiO layer is formed to a thickness of 4 nm on each of the first to fourth semiconductor substrates by an ALD method. NMOS transistors are formed in the first to fourth semiconductor substrates.

In the graph of FIG. 10, capacitance Cp [nF] is plotted versus gate voltage Vg [V]. The curves 101, 102, 103, and 104 show C-V characteristics of the NMOS transistors formed in the first, second, third, and fourth semiconductor substrates, respectively. As shown, the C-V characteristic changes in the direction of an arrow 105 according to the dose of nitrogen used to form the nitrogen-incorporated active region. In other words, the Vfb of the HfSiO layer is moved toward a negative direction without a change in capacitance equivalent thickness CET in accordance with the increase in the dose of nitrogen. For example, Vfb of the curve 104 is moved by 0.2 to 0.3 V toward the negative direction compared to the curve 101.

This may indicate that the CET of the HfSiO layer by the ALD method has the same or substantially the same thickness and/or that the HfSiO layer by the ALD method may be deposited at a lower temperature as compared to the thermal oxidation method.

Figure 11:
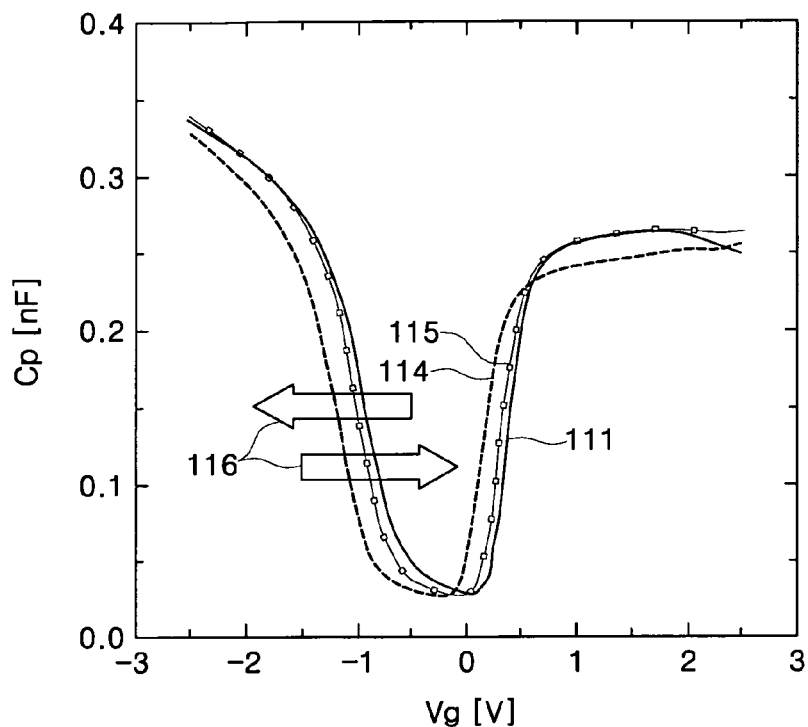
FIG. 11 is a graph showing change in a C-V characteristic of an NMOS transistor due to annealing and the formation of a nitrogen-incorporated active region in the high-k dielectric layer by an ALD method.

FIG. 11 is a graph showing change in a C-V characteristic of NMOS transistors due to annealing and the formation of a nitrogen-incorporated active region in the high-k dielectric layer using an ALD method. Referring to FIG. 11, first to third semiconductor substrates each having a p-well are prepared. A nitrogen-incorporated active region is formed in each of the second and third semiconductor substrates. Nitrogen is implanted into the second and third semiconductor substrates with a dose of $1\times10^{15}$ ions/cm$^2$ and an energy of 10 KeV by an ion implantation method. The third semiconductor substrate is annealed for 10 seconds at a temperature of 1000° C. Subsequently, an ALD method is employed to form an HfSiO layer having a thickness of 4 nm on each of the first to third semiconductor substrates. NMOS transistors are formed in the first to third semiconductor substrates.

In the graph of FIG. 11, capacitance Cp [nF] is plotted versus gate voltage Vg [V]. The curves 111, 114, and 115 show C-V characteristics of the NMOS transistors formed in the first, second, and third semiconductor substrates, respectively.

As shown in FIG. 11, the C-V characteristic changes in the direction of an arrow 116 according to the annealing. In other words, the Vfb of the HfSiO layer is moved toward the negative direction without a change in CET according to the increase in dose of the nitrogen, the curve 115 tends to move toward the curve 111 according to the annealing. This may indicate that the nitrogen is out-diffused due to the annealing.

As shown from the FIGS. 10 and 11, when the nitrogen-incorporated active region is formed in the semiconductor substrate and the HfSiO layer is formed on the nitrogen-incorporated active region by an ALD method, the threshold voltage Vth of the NMOS transistor may be adjusted without changing the CET.

Figure 12:
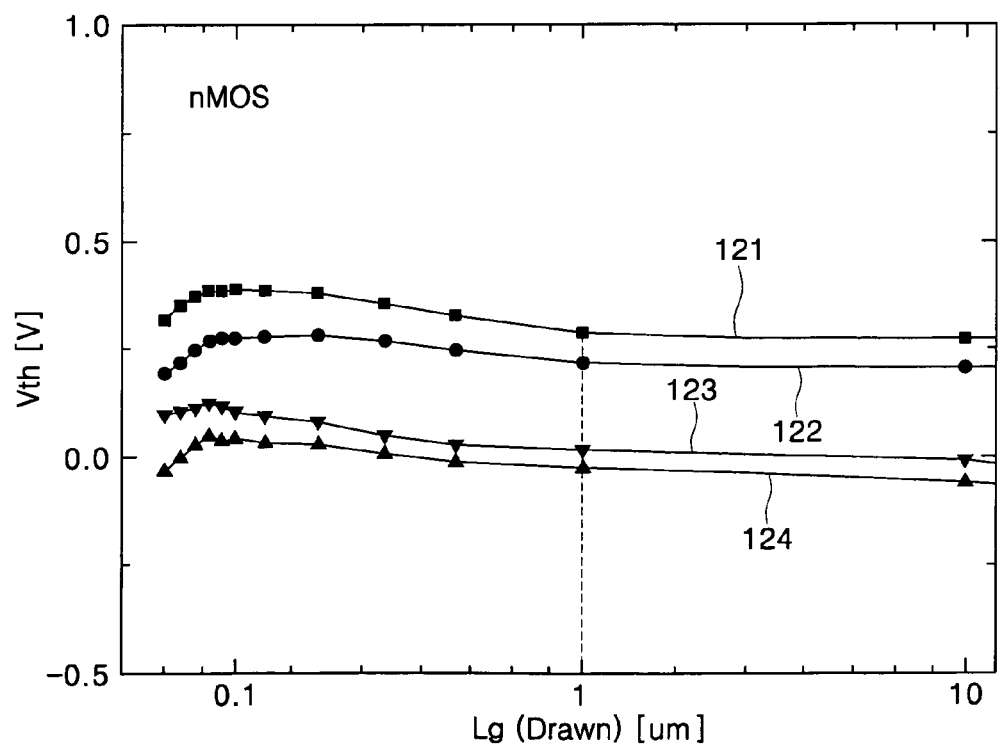
FIG. 12 is a graph showing a change in threshold voltage Vth according to a dose of nitrogen.

FIG. 12 is a graph showing a change in threshold voltage Vth according to a dose of nitrogen. Referring to FIG. 12, first to fourth semiconductor substrates each having a p-well are prepared. A pad oxide layer is formed to a thickness of 11 nm on the fourth semiconductor substrate. A nitrogen-incorporated active region is formed in each of the second to fourth semiconductor substrates. Nitrogen is implanted into the second semiconductor substrate with a dose of $5\times10^{14}$ ions/cm$^2$ and an energy of 10 KeV, into the third semiconductor substrate with a dose of $1\times10^{15}$ ions/cm$^2$ and an energy of 10 KeV, and into the fourth semiconductor substrate with a dose of $1\times10^{15}$ ions/cm$^2$ and an energy of 30 KeV, using an ion implantation method. The pad oxide layer is removed to expose a top surface of the fourth semiconductor substrate. A HfSiO layer is formed to a thickness of 4 nm on each of the first to fourth semiconductor substrates by an ALD method. The first to fourth semiconductor substrates are annealed for 30 seconds at a temperature of 900° C. NMOS transistors are formed in the first to fourth semiconductor substrates. Each of the NMOS transistors has a channel width of 10 um and a channel length of 0.08 to 10 um.

In the graph of FIG. 12, threshold voltage Vth [V] is plotted versus channel length Lg [um]. The curves 121, 122, 123, and 124 show threshold voltages Vth of the NMOS transistors formed in the first, second, third, and fourth semiconductor substrates, respectively. The threshold voltage Vth changes according to the dose of nitrogen. For example, at a channel length Lg of 1 um, a Vth difference is 0.07V between the curves 121 and 122, 0.33V between the curves 121 and 124, and 0.28V between the curves 121 and 123. In other words, at the channel length Lg of 1 um, the threshold voltage Vth difference is 0.07V between the transistor formed in the first semiconductor substrate and the transistor formed in the second semiconductor substrate, 0.33V between the transistor formed in the first semiconductor substrate and the transistor formed in the third semiconductor substrate, and 0.28V between the transistor formed in the first semiconductor substrate and the transistor formed in the fourth semiconductor substrate. This may indicate a reduction of threshold voltage Vth by 0.3V according to the dose of nitrogen.

Figure 13:
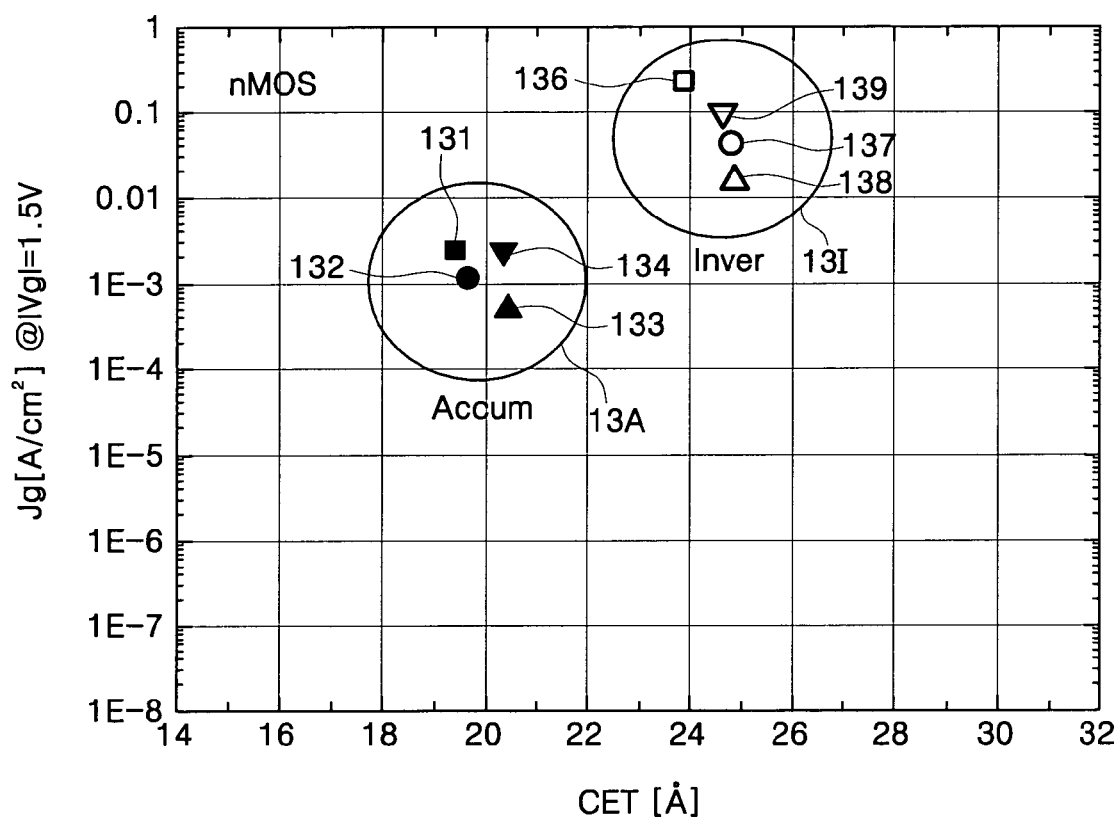
FIG. 13 is a characteristic diagram showing changes in gate leakage current density and capacitance equivalent thickness according to a dose of nitrogen.

FIG. 13 is a characteristic diagram showing changes in gate leakage current density Jg and capacitance equivalent thickness CET according to a dose of nitrogen. Referring to FIG. 13, first to fourth semiconductor substrates each having a p-well are prepared. A pad oxide layer is formed to a thickness of 11 nm on the fourth semiconductor substrate. A nitrogen-incorporated active region is formed in each of the second and fourth semiconductor substrates. Nitrogen is implanted into the second semiconductor substrate with a dose of $5\times10^{14}$ ions/cm$^2$ and an energy of 10 KeV, into the third semiconductor substrate with a dose of $1\times10^{15}$ ions/cm$^2$ and an energy of 10 KeV, and into the fourth semiconductor substrate with a dose of $1\times10^{15}$ ions/cm$^2$ and an energy of 30 KeV, by an ion implantation method. The pad oxide layer is removed to expose a top surface of the fourth semiconductor substrate. A HfSiO layer is formed to a thickness of 4 nm on each of the first to fourth semiconductor substrates by an ALD method. The first to fourth semiconductor substrates are annealed for 30 seconds at a temperature of 900° C. NMOS transistors are formed in the first to fourth semiconductor substrates.

In the diagram of FIG. 13, CET [Å] is plotted versus gate leakage current density Jg [A/cm$^2$] under a condition having an absolute value of a gate voltage of 1.5V. Points within the circle 13A are values measured in an accumulation mode, and points within the circle 131 are values measured in an inversion mode. Points 131 and 136 indicate the CET of the gate dielectric layer and the gate leakage current density Jg of the NMOS transistor formed in the first semiconductor substrate, points 132 and 137 indicate the CET of the gate dielectric layer and the gate leakage current density Jg of the NMOS transistor formed in the second semiconductor substrate, points 133 and 138 indicate the CET of the gate dielectric layer and the gate leakage current density Jg of the NMOS transistor formed in the third semiconductor substrate, and points 134 and 139 indicate the CET of the gate dielectric layer and the gate leakage current density Jg of the NMOS transistor formed in the fourth semiconductor substrate.

As shown in FIG. 13, the gate leakage current density Jg changes according to the dose of nitrogen. For example, gate leakage current density Jg may be more greatly reduced in the points 133 and 138 as compared to points 131 and 136. In other words, the NMOS transistor formed in the third semiconductor substrate has a lower gate leakage current density Jg than the NMOS transistor formed in the first semiconductor substrate. In addition, the CETs of the gate dielectric layer formed on the first to fourth semiconductor substrates show a change in 1 Å or less. This may indicate that the CET of the gate dielectric layer has the same or substantially the same value regardless of presence or absence of the nitrogen-incorporated active region.

According to at least one example embodiment of the present invention as described above, a nitrogen-incorporated active region may be formed within a semiconductor substrate of a first region. A first gate dielectric layer and a first gate electrode may be stacked (e.g., sequentially) on the nitrogen-incorporated active region. A second gate dielectric layer and a second gate electrode may be stacked (e.g., sequentially) on a semiconductor substrate of a second region. The first gate dielectric layer may have a high-k dielectric layer and a nitrogen contained high-k dielectric layer. The second gate dielectric layer may also have a high-k dielectric layer. The first gate dielectric layer may have the same or substantially the same thickness as the second gate dielectric layer. The first gate dielectric layer may have a relatively lower threshold voltage Vth as a result of the nitrogen contained high-k dielectric layer and the nitrogen-incorporated active region. This may result in a semiconductor device capable of controlling a threshold voltage Vth while using the high-k dielectric layer as a film-forming material of a gate dielectric layer.

Example embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   a semiconductor substrate having a first region and a second region;
   a first well disposed within the first region;
   a nitrogen-incorporated active region formed within the first region;
   a first gate dielectric layer formed on the nitrogen-incorporated active region, the first gate dielectric layer including a first dielectric layer and a second dielectric layer, the second dielectric layer including diffused nitrogen from the nitrogen-incorporated active region;
   a first gate electrode disposed on the first gate dielectric layer;
   a second well disposed within the second region;
   an active region that is not a nitrogen incorporated region formed within the second region;
   a second gate dielectric layer formed on the second region, the second gate dielectric layer including another first dielectric layer; and a second gate electrode formed on the second gate dielectric layer; wherein the first well is a p-well, and the second well is an n-well or p-well, and the first gate dielectric layer has the same thickness as the second gate dielectric layer.

2. The semiconductor device according to claim 1, wherein the first dielectric layer is a hafnium oxide (HfO) layer, a zirconium oxide (ZrO) layer, an aluminum oxide (AlO) layer, an aluminum nitride (AlN) layer, a titanium oxide (TiO) layer, a lanthanum oxide (LaO) layer, an yttrium oxide (YO) layer, a gadolinium oxide (GdO) layer, a tantalum oxide (TaO) layer, an aluminate layer, a metal silicate layer or a combination thereof.

3. The semiconductor device according to claim 1, wherein each of the first and second gate dielectric layers has a capping dielectric layer, the capping dielectric layer being a dielectric layer different from the first dielectric layer and contacting the first and second gate electrodes, the second dielectric layer being disposed between the semiconductor substrate and the first dielectric layer.

4. The semiconductor device according to claim 3, wherein the capping dielectric layer is one of a hafnium oxide (HfO) layer, a zirconium oxide (ZrO) layer, an aluminum oxide (AlO) layer, an aluminum nitride (AlN) layer, a titanium oxide (TiO) layer, a lanthanum oxide (LaO) layer, an yttrium oxide (YO) layer, a gadolinium oxide (GdO) layer, a tantalum oxide (TaO) layer, an aluminate layer, a metal silicate layer or a combination thereof.

5. The semiconductor device according to claim 1, wherein each of the first and second gate electrodes includes one of a polysilicon layer, a metal layer, a metal suicide layer or a combination thereof.

6. The semiconductor device according to claim 5, wherein each of the first and second gate electrodes has a barrier metal layer, the barrier metal layer being in contact with the first and second gate dielectric layers.

7. The semiconductor device according to claim 6, wherein the barrier metal layer is one of a titanium (Ti) layer, a tantalum (Ta) layer, a hafnium (Hf) layer, a zirconium (Zr) layer, an aluminum (Al) layer, a copper (Cu) layer, a tungsten (W) layer, a molybdenum (Mo) layer, a platinum (Pt) layer, a ruthenium (Ru) layer, a ruthenium oxide (RuO) layer, a titanium nitride (TiN) layer, a tantalum nitride (TaN) layer, a hafnium nitride (HfN) layer, a zirconium nitride (ZrN) layer, a tungsten nitride (WN) layer, a molybdenum nitride (MoN) layer, a titanium aluminum nitride (TiAlN) layer, a tantalum aluminum nitride (TaAlN) layer, a titanium silicon nitride (TiSiN) layer, a tantalum silicon nitride (TaSiN) layer or a combination thereof.

8. The semiconductor device according to claim 1, further including, an insulating spacer disposed on sidewalls of the first and second gate electrodes, wherein the insulating spacer is one of a silicon oxide layer, a silicon nitride layer, a silicon oxynitride layer or a combination thereof.

9. The semiconductor device of claim 1, wherein the second dielectric layer contacts the nitrogen-incorporated active region.

10. The semiconductor device of claim 1, wherein the second dielectric layer is directly on the nitrogen-incorporated active region.

11. A semiconductor device, comprising:

a semiconductor substrate having a first region and a second region;

a first well disposed within the first region;

a nitrogen-incorporated active region formed within the first region;

a first gate dielectric layer formed on the nitrogen-incorporated active region, the first gate dielectric layer including a high-k dielectric layer and a nitrogen contained high-k dielectric layer;

a first gate electrode disposed on the first gate dielectric layer;

a second well disposed within the second region;

an active region that is not a nitrogen incorporated region formed within the second region;

a second gate dielectric layer formed on the second region, the second gate dielectric layer including another high-k dielectric layer; and a second gate electrode formed on the second gate dielectric layer, wherein the first well is a p-well, and the second well is an n-well or p-well.

12. The semiconductor device of claim 11, wherein the nitrogen contained high-k dielectric layer is in contact with the nitrogen-incorporated active region.

13. The semiconductor device of claim 11, wherein the nitrogen contained high-k dielectric layer includes diffused nitrogen from the nitrogen-incorporated active region.

14. The semiconductor device of claim 11, wherein the first gate dielectric layer has the same thickness as the second gate dielectric layer.

15. The semiconductor device of claim 11, wherein the high-k dielectric layer is one selected from a group consisting of a hafnium oxide (HfO) layer, a zirconium oxide (ZrO) layer, an aluminum oxide (AlO) layer, an aluminum nitride (AlN) layer, a lanthanum oxide (LaO) layer, an yttrium oxide (YO) layer, a gadolinium oxide (GdO) layer, an aluminate layer, a metal silicate layer, and a combination layer thereof.

* * * * *